(12) United States Patent
Liu

(10) Patent No.: US 8,430,124 B2
(45) Date of Patent: Apr. 30, 2013

(54) VENTILATING APPARATUS

(75) Inventor: Chih-I Liu, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 425 days.

(21) Appl. No.: 12/842,278

(22) Filed: Jul. 23, 2010

(65) Prior Publication Data

US 2011/0277861 A1  Nov. 17, 2011

(30) Foreign Application Priority Data

May 12, 2010 (TW) ............................... 99115057 A

(51) Int. Cl.
*F16K 11/20* (2006.01)
*B23K 31/00* (2006.01)
*B23K 31/02* (2006.01)

(52) U.S. Cl.
USPC ......... 137/597; 137/561 A; 137/583; 228/4.5; 228/180.5

(58) Field of Classification Search ............... 137/597, 137/561 A, 561 R, 583, 599.01, 599.03, 599.11, 137/599.12, 599.12 A; 228/180.5, 904, 4.5, 228/218–220, 42

See application file for complete search history.

(56) References Cited

U.S. PATENT DOCUMENTS

| | | | |
|---|---|---|---|
| 419,993 A * | 1/1890 | Hilliker | 137/599.11 |
| 3,771,547 A * | 11/1973 | Coleman | 137/599.01 |
| 4,575,602 A | 3/1986 | Sakurai | |
| 6,234,376 B1 | 5/2001 | Wicen | |
| 6,267,290 B1 | 7/2001 | Murdeshwar | |
| 7,658,313 B2 * | 2/2010 | Nishiura et al. | 228/180.5 |

* cited by examiner

*Primary Examiner* — Stephen M Hepperle
*Assistant Examiner* — Seth Faulb
(74) *Attorney, Agent, or Firm* — Ming Chow; Sinorica, LLC

(57) ABSTRACT

This invention discloses a ventilating apparatus which has a configuration extending along a first axis, a second axis and a third axis. The first axis, the second axis and the third axis are orthogonal to each other. The ventilating apparatus includes a main body and a tail pipe. The main body has a head end and a tail end disposed along the second axis, two sidewalls disposed along the third axis, and the first aperture along the first axis. The ventilating apparatus further includes a first air orifice which extends along the second axis and passes through from the tail end to the first aperture, and the bypassing air orifices which connect the first air orifice and the first aperture. The tail pipe has a second aperture which is connected to the first aperture of the main body.

18 Claims, 4 Drawing Sheets

VENTILATING APPARATUS

BACKGROUND OF THE INVENTION

1. Technical Field

The present invention relates to ventilating apparatuses, and more particularly to a ventilating apparatus applied to a wire bonder for semiconductor devices in order to ensure circulation of protective gas.

2. Description of Related Art

In the known packaging technology for semiconductor devices, wire bonding is used to achieve transmission of signals on dies to carriers (e.g. leadframes, substrates, etc.), and external terminals (e.g. solder balls or lead fingers of lead frames, etc.) then serve for connection to PCBs. Formation of such a wire bond mainly involves using a capillary to deliver a metal wire, such as a copper wire, a silver wire, a gold wire or the like, and forming a FAB (Free Air Ball) at the distal of the wire while implementing a gas supplying device to continuously provide protective gas so as to secure good formation of the FAB. The foregoing protective gas is preferably nitrogen gas, argon gas or nitrogen and hydrogen mixed gas. Therein, nitrogen gas and argon gas are capable of protecting the FAB from oxidization, and hydrogen in nitrogen and hydrogen mixed gas can further restore the oxidized part of the FAB, thereby facilitating good formation of the FAB. At last, the FAB connected with the wire bond is attached to the die or a pad on the carrier. Thus, effective control of the wire bonding process can be achieved, and in turn the high yield of semiconductor packaging can be ensured. As to the wire bonding process, some prior arts such as U.S. Pat. No. 6,234,376 and U.S. Pat. No. 4,575,602 have proposed the approach of employing a ventilating apparatus to deliver protective gas to the melted copper wire or gold wire so as to facilitate sintering the spherical FAB. However, both of the prior arts are limited to unidirectional provision of protective gas and disadvantageously lead to unstable or turbulent flow of protective gas in the ventilating apparatus, which in turn causes abnormal FAB sintering, such as brakeage, eccentrics, damage, chipping and so on, each leading to failed die after the wire bonding process.

On the other hand, there are prior arts focused on maintaining protective gas around the formed FAB until the wire bonding process so as to protect the FAB from oxidization and in turn from abnormalities. Therein, an additional gas pipe is required to supply the protective gas such as nitrogen gas, argon gas or nitrogen and hydrogen mixed gas to the formed FAB. However, the additional gas pipe needs to be mechanically controlled and this certainly means increased costs for equipment and inconvenience in operation.

SUMMARY OF THE INVENTION

In an attempt to overcome the defects of the prior arts, the present invention provides a ventilating apparatus having a configuration extending along a first axis, a second axis and a third axis, wherein the first axis, the second axis and the third axis are orthogonal to each other. The ventilating apparatus comprises a main body and a tail pipe. The main body having a head end and a tail end disposed along the second axis, two sidewalls disposed along the third axis, and a first aperture passing there through along the first axis near the head end of the main body, wherein the main body further has a first air orifice and bypassing air orifices, the first air orifice being configured along the second axis and passing from the tail end of the main body to the first aperture, and the bypassing air orifices connecting the first air orifice and the first aperture. The tail pipe being connected to the tail end of the main body and having a second aperture passing there through along the second axis, wherein the second aperture is connected to the first air orifice.

Thus, a primary objective of the present invention is to provide a ventilating apparatus, which uses a first air orifice and bypassing air orifices (second air orifices, third air orifices and fourth air orifices) to guide protective gas, so as to prevent turbulent flow of protective gas in the first aperture of the ventilating apparatus, and thereby form a relatively stable layer of protective gas around the FAB during its formation, causing the sintered FAB to have improved shape evenness.

The present invention further provides another ventilating apparatus having a configuration extending along a first axis, a second axis and a third axis, wherein the first axis, the second axis and the third axis are orthogonal to each other. The ventilating apparatus comprises a main body, a tail pipe and an outer pipe. The main body having a head end and a tail end disposed along the second axis, two sidewalls disposed along the third axis, and a first aperture passing therethrough along the first axis near the head end of the main body, wherein the main body further has a first air orifice and bypassing air orifices, the first air orifice being configured along the second axis and passing from the tail end of the main body to the first aperture, and the bypassing air orifices connecting the first air orifice and the first aperture. The tail pipe being connected to the tail end of the main body and having a second aperture passing therethrough along the second axis, wherein the second aperture is connected to the first air orifice. The outer pipe having a bottom segment and two side segments connected to two ends of the bottom segment so as to be formed as a U-shaped pipe that allows the main body to be fittingly received in an area defined by the U-shaped pipe with the head end of the main body adjacent to the bottom segment, the outer pipe further comprising bypassing channels and a plurality of air vents, the bypassing channels being configured inside the bottom segment and the side segments, and the air vents connecting the bypassing channels to an exterior of the outer pipe.

Another objective of the present invention is to provide a ventilating apparatus, which uses a first air orifice and bypassing air orifices (second air orifices, third air orifices and fourth air orifices) to guide protective gas, so as to prevent turbulent flow of protective gas in the first aperture of the ventilating apparatus, and thereby form a relatively stable layer of protective gas around the FAB during its formation, causing the sintered FAB to have improved shape evenness.

Still another objective of the present invention is to provide a ventilating apparatus, which uses an outer pipe to dispense with additional gas pipes for protective gas such as nitrogen gas, argon gas or nitrogen and hydrogen mixed gas that would be required in the prior art, so as to reduce costs for equipment and improve operational convenience.

The present invention further provides another ventilating apparatus having a configuration extending along a first axis, a second axis and a third axis, wherein the first axis, the second axis and the third axis are orthogonal to each other. The ventilating apparatus comprises a main body, a tail pipe and an outer pipe. The main body having a head end and a tail end disposed along the second axis, two sidewalls disposed along the third axis, a first aperture passing therethrough along the first axis near the head end of the main body, and a first air orifice extending along the second axis, wherein the first air orifice passes through from the tail end of the main body to the first aperture. The tail pipe being connected to the tail end of the main body and having a second aperture passing therethrough along the second axis, wherein the second aperture is connected to the first air orifice. The outer pipe having a bottom segment and two side segments connected to two ends of the bottom segment so as to be formed as a U-shaped pipe that allows the main body to be fittingly received in an area defined by the U-shaped pipe with the head end of the main body adjacent to the bottom segment, the outer pipe further comprising bypassing channels and a plurality of air vents, the bypassing channels being configured inside the bottom segment and the side segments, and the air vents connecting the bypassing channels to an exterior of the outer pipe.

Another objective of the present invention is to provide a ventilating apparatus, which uses an outer pipe to dispense with additional gas pipes for protective gas such as nitrogen gas, argon gas or nitrogen and hydrogen mixed gas that would be required in the prior art, so as to reduce costs for equipment and improve operational convenience.

BRIEF DESCRIPTION OF THE DRAWINGS

The invention as well as a preferred mode of use, further objectives and advantages thereof will be best understood by reference to the following detailed description of illustrative embodiments when acquire in conjunction with the accompanying drawings, wherein.

DETAILED DESCRIPTION OF THE INVENTION

While the present invention discloses embodiments of a ventilating apparatus to be applied to a wire bonder for semiconductor devices, the manufacturing principles and basic features of wire bonding have been known to people of ordinary skill in the art, and thus will not be described in any length herein. Meantime, the accompany drawings to be read in conjunction with this description are intended to graphically illustrate the featured structure of the present invention and need not to be made to scale.

Figure 1A:
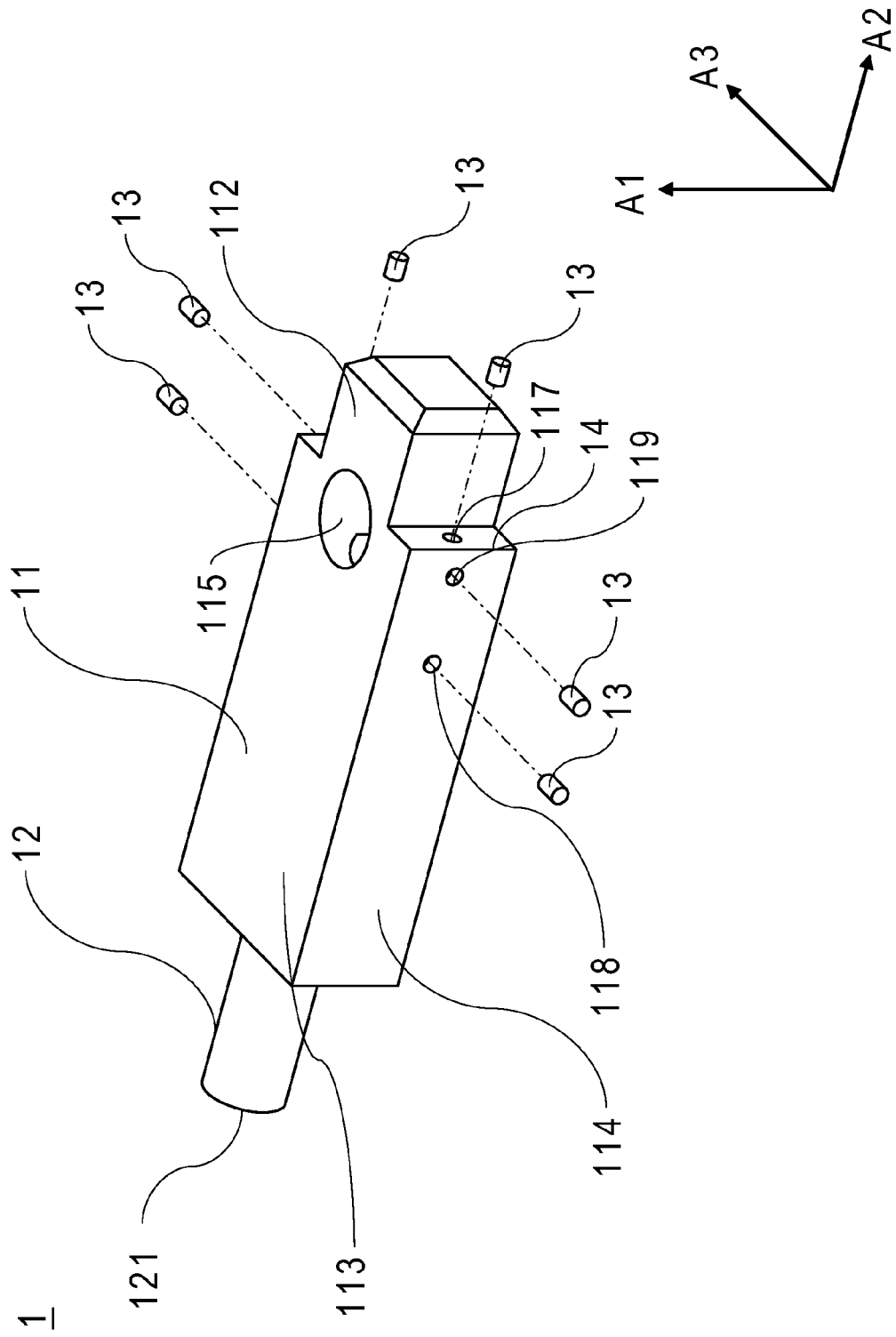
FIG. 1A is a perspective schematic view of a ventilating apparatus according to a first preferred embodiment of the present invention.

First referring to FIG. 1A, a first preferred embodiment of the present invention is a ventilating apparatus 1 has a configuration extending along a first axis A1, a second axis A2 and a third axis A3, wherein the first axis A1, the second axis A2 and the third axis A3 are orthogonal to each other. The ventilating apparatus 1 mainly comprises a main body 11 and a tail pipe 12.

The main body 11 has a head end 112 and a tail end 113 disposed along the second axis A2, two sidewalls 114 disposed along the third axis A3, and a first aperture 115 passing through the main body 11 along the first axis A1 at a location near the head end 112. The first aperture 115 is configured to allow a capillary (not shown) which is supplied therein with a metal wire, such as a copper wire, a silver wire or a gold wire to pass therethrough. The main body 11 further includes a discharging device (not shown). When the metal wire is vertically moved into the first aperture 115 of the main body 11 by the capillary, the metal wire is distally heated by the discharging device and melted to be sintered and form a FAB.

Figure 1B:
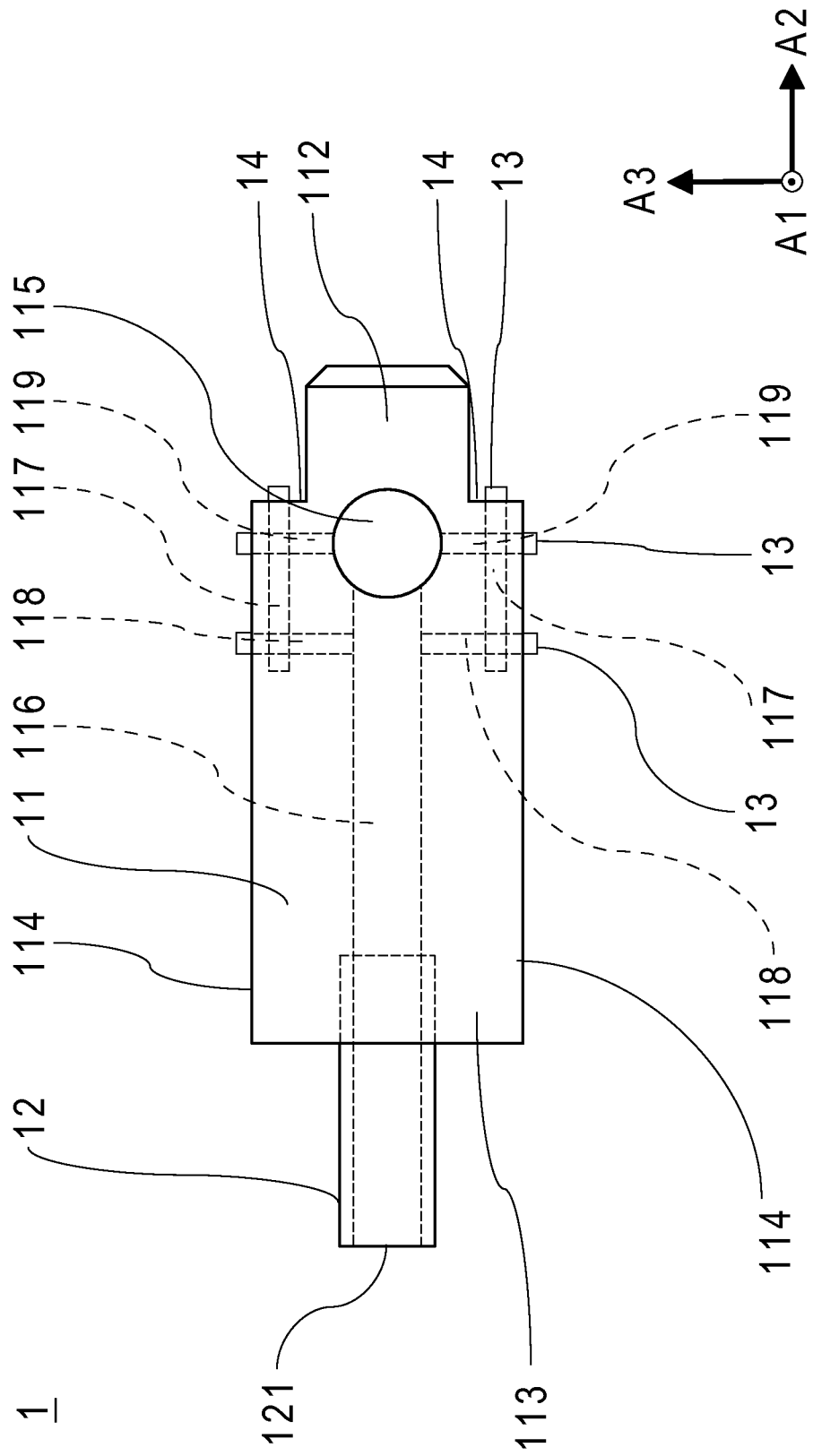
FIG. 1B is a top schematic view of the ventilating apparatus according to the first preferred embodiment of the present invention.

Referring to FIG. 1B, the main body 11 further comprises a first air orifice 116 and bypassing air orifices. The first air orifice 116 is along the second axis A2 and passes through the tail end 113 of the main body to the first aperture 115. The bypassing air orifices includes a pair of second air orifices 117 being along the second axis A2, a pair of third air orifices 118 being along the third axis A3 and a pair of fourth air orifices 119 being along the third axis A3. Therein, each of the second air orifices 117 has two ends thereof closed while an end of each said third air orifice 118 near the sidewall 114 of the main body 11 and an end of each said fourth air orifice 119 near the sidewall 114 of the main body 11 are also closed. Meantime, the third air orifices 118 connect the second air orifices 117 and the first air orifice 116 while the fourth air orifices 119 connect the second air orifices 117 and the first aperture 115. The first aperture 115 is configured between the two second air orifices 117. Thereby, the bypassing air orifices connect the first air orifice 116 and the first aperture 115, so the protective gas in the first air orifice 116 can be not only directly introduced into the first aperture 115, but also be guided to the first aperture 115 through the bypassing air orifices, namely by way of the third air orifices 118, the second air orifices 117 and the fourth air orifices 119. It is to be noted that each of the second air orifices 117, the third air orifices 118 and the fourth air orifices 119 has a diameter smaller than both the first aperture 115 and the first air orifice 116.

Moreover, the tail pipe 12 of the ventilating apparatus 1 is connected to the tail end 113 of the main body 11. The tail pipe 12 is past by a second aperture 121 that extends along the second axis A2 and is connected to the first air orifice 116. The tail pipe 12 is configured to connect externally a gas supply system (not shown) and a discharging device (not shown). Thereby, the protective gas introduced from the second aperture 121 of the tail pipe 12 can be guided by the first air orifice 116 and the bypassing air orifices (i.e. the second air orifices 117, the third air orifices 118 and the fourth air orifices 119) to form a gas barrier in the first aperture 115. The foregoing structure matters physically. According to Bernoulli's Principle, as the velocity of a fluid increases, the pressure exerted by that fluid decreases and vice versa. Meantime, it is known that the velocity of the relative motion between two objects causes a fluid between two objects to flow. When the metal wire installed in the capillary enters the first aperture 115 of the main body 11 getting melted and sintered into a FAB, since the metal wire itself is substantial in volume, the air capacity in the first aperture 115 is reduced as a respond to the entry of the metal wire, and when the metal wire is withdrawn from the first aperture 115, the first aperture 115 has its initial air capacity recovered. Therefore, while the metal wire rapidly goes in and out the first aperture 115, the protective gas between the metal wire and the first aperture 115 is driven to flow. In addition, the different moving directions of the metal wire for entering and exiting the first aperture 115 cause variation of the pressure of the protective gas, and in turn lead to inconsistent fluid speed that is a reason of turbulent gas flow in the first aperture 115. With unreliable coverage of the turbulent flow of the protective gas, the metal wire when getting melted and sintered into the FAB tends to form uneven spherical shape and become a defective product. In the present invention, the protective gas can be guided by the first air orifice 116 and the bypassing air orifices (i.e. the second air orifices 117, the third air orifices 118 and the fourth air orifices 119) and the turbulent gas flow in the first aperture 115 can be prevented so that a relatively stable layer of protective gas can be formed around the FAB during its formation, causing the sintered FAB to have improved shape evenness.

At the second air orifices 117 about the head end 112 of the main body 11, there may be further formed a pair of depressed shoulder portions 14, which serve to receive and position additional gas pipes (not shown), so that the gas pipes are enabled to accurately introduce protective gas such as nitrogen gas, argon gas or nitrogen and hydrogen mixed gas to the produced FAB, so as to protect the FAB from oxidization.

On the other hand, when the second air orifices 117, the third air orifices 118 and the fourth air orifices 119 are mechanically processed (such as made through drilling), for preventing the protective gas from flowing outside the main body 11 of the ventilating apparatus 1, and for achieving the above-mentioned result that the two ends of the second air orifices 117 are closed while the ends of the third air orifices 118 and the fourth air orifices 119 near the sidewalls 114 of the main body are also closed, sealing members 13 may be added to the second air orifices 117 near the head end 112 of the main body, to the third air orifices 118 near the sidewalls 114 of the main body, and to the fourth air orifices 119 near the sidewalls 114 of the main body. The sealing members 13 may be made of airtight tape, plastic, rubber or resin. However, when the main body 11 is formed through molding, and the features that the two ends of the second air orifices 117 are closed while the ends of the third air orifices 118 and the fourth air orifices 119 near the sidewalls 114 of the main body are also closed are accomplished during the molding process, there is no need for the sealing member.

Figure 2:
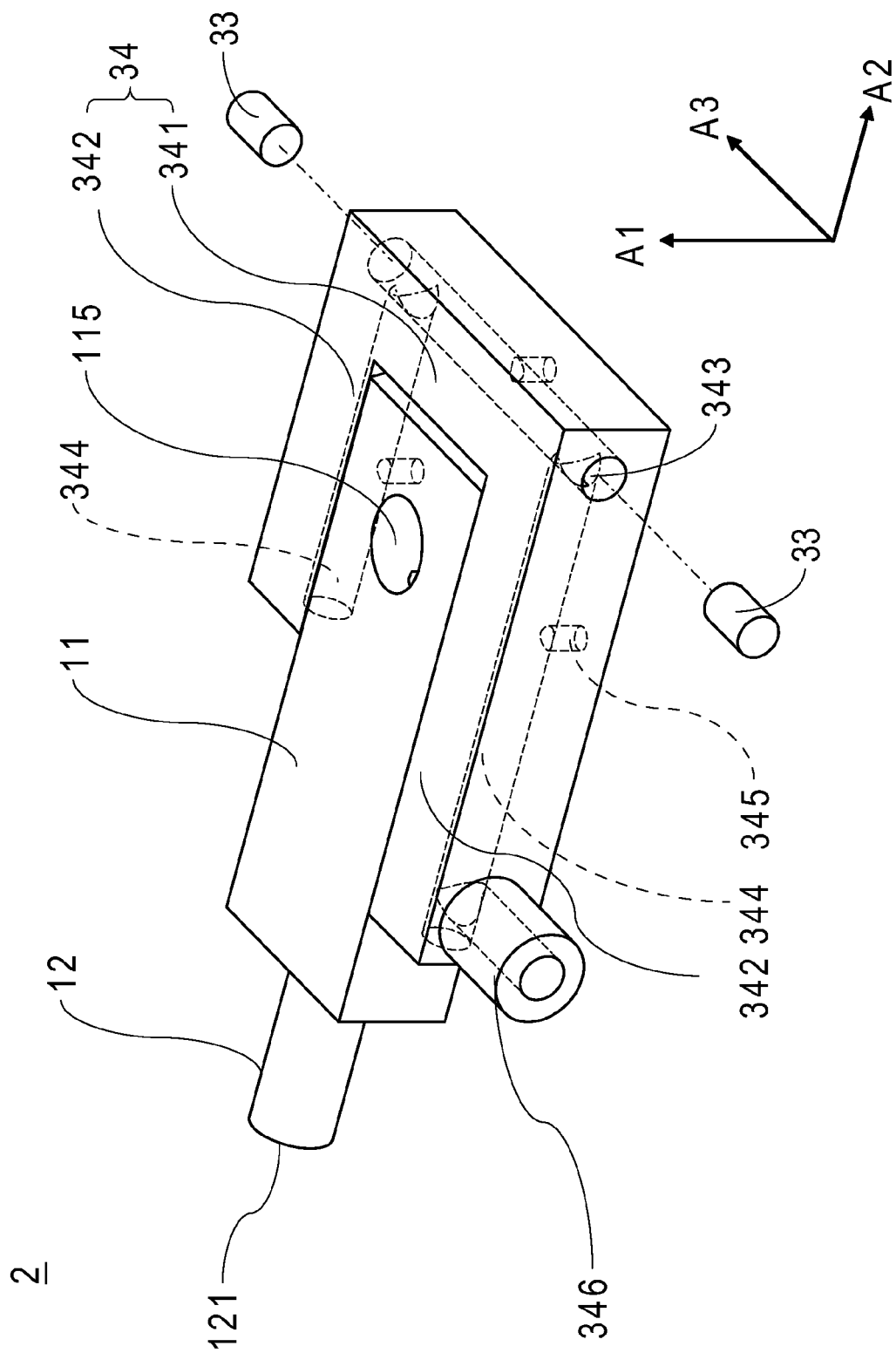
FIG. 2 is a perspective schematic view of a ventilating apparatus according to a second preferred embodiment of the present invention.

Referring to FIG. 2, in a second preferred embodiment of the present invention, a ventilating apparatus 2 has a configuration extending along a first axis A1, a second axis A2 and a third axis A3, wherein the first axis A1, the second axis A2 and the third axis A3 are orthogonal to each other. The ventilating apparatus 2 mainly comprises a main body 11, a tail pipe 12 and an outer pipe 34. Therein, the main body 11 and the tail pipe 12 have features and effects substantially equal to those of the main body 11 and the tail pipe 12 of the first preferred embodiment, as shown in FIG. 1A and FIG. 1B, and will not be repeatedly described herein.

In the present embodiment, the ventilating apparatus 2 further has the outer pipe 34, which is connected to a gas pipe (not shown) supplying protective gas such as nitrogen gas, argon gas or nitrogen and hydrogen mixed gas. Therein, the outer pipe 34 includes a bottom segment 341 and two side segments 342 connected to two ends of the bottom segment 341, thus forming a U-shaped pipe that fittingly receives the main body 11 in the U-shaped area enclosed by the U-shaped pipe so that the outer pipe 34 circles the main body 11 and the main body 11 has the head end 312 facing the bottom segment 341. The U-shaped outer pipe 34 is configured to guide the protective gas (e.g. nitrogen gas, argon gas or nitrogen and hydrogen mixed gas) to the formed FAB, so as to protect the FAB from being deformed by external air that invades the protective gas because of the vertical movement of the capillary that brings the external air into the first aperture 115. Thereby, the present invention can dispense with the mechanically controlled gas supplying devices such as nitrogen gas pipes, argon gas pipes and the like, so as to reduce costs and improve operational convenience.

Still referring to FIG. 2, since the present invention has the outer pipe 34, the use of those gas pipes such as nitrogen gas pipes, argon gas pipes or nitrogen and hydrogen mixed gas pipes required by the prior art can be omitted. Thus, it is not necessary for the main body 11 of the present embodiment to have the depressed shoulder portions 14 (shown in FIG. 1B) as used in the first embodiment.

It is to be noted that the outer pipe 34 further comprises bypassing channels and a plurality of air vents 345. The bypassing channels are configured inside the bottom segment 341 and the side segments 342, and further include a fifth air orifice 343 along the third axis A3 and a pair of sixth air orifices 344 along the second axis A2. Therein, the fifth air orifice 343 has two ends closed while each said sixth air orifice 344 has one end closed and both of the sixth air orifices 344 are connected to the fifth air orifice 343. Therefore, each of the plural air vents 345 has one end connected to the bypassing channels and an opposite end connected to the exterior of the outer pipe 34. Furthermore, the configuration of the outer pipe 34 is not limited to the disclosure of the present invention and may be reversed according to practical needs.

Keeping looking at FIG. 2, an air inlet 346 attached to the outer pipe 34 has one end connected to a supply of nitrogen gas, argon gas or nitrogen and hydrogen mixed gas, and an opposite end connected to the sixth air orifice 344. The air inlet 346 also includes therein a channel that is connected to the bypassing channels inside the side segments 342 so that the nitrogen gas, argon gas or nitrogen and hydrogen mixed gas entering from the air inlet 346 can flow along the bypassing channels and discharged from the air vents 345 to form the protective gas of nitrogen gas, argon gas or nitrogen and hydrogen mixed gas. Therein, the configuration of the air inlet 346 is not limited to the disclosure of the present invention and may be arranged upward or downward, or abreast with the tail pipe 12, according to practical needs.

Moreover, when the fifth air orifice 343 is mechanically processed (such as made through drilling), for preventing the protective gas from flowing out of the outer pipe 34, a sealing member 33 may be added to the fifth air orifice 343 near the outer pipe 34. The sealing member 33 may be made of airtight tape, plastic, rubber or resin. However, when the outer pipe 34 is formed through molding, there is no need for the sealing member.

Figure 3:
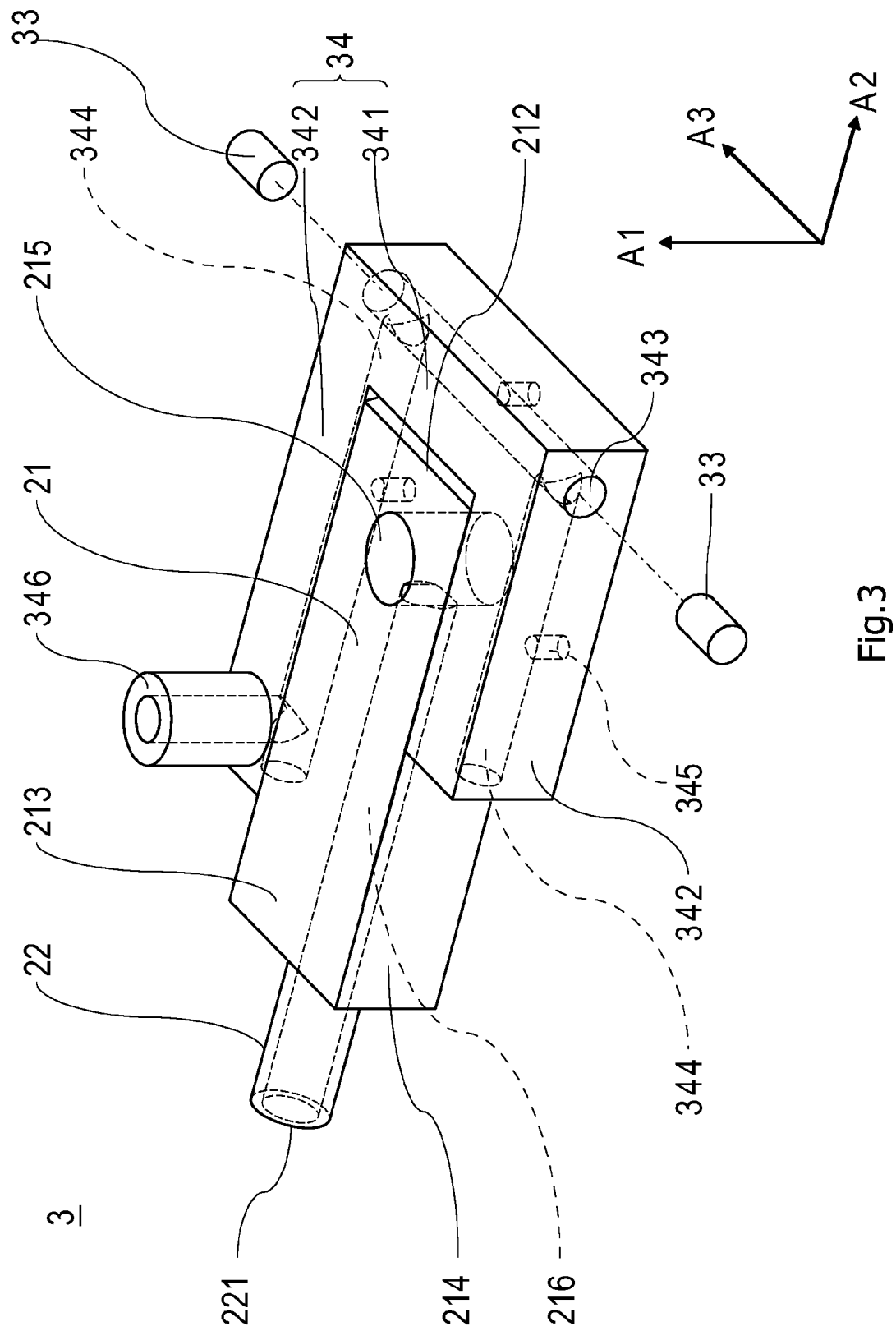
FIG. 3 is a perspective schematic view of a ventilating apparatus according to a third preferred embodiment of the present invention.

Referring to FIG. 3, a ventilating apparatus 3 according to a third preferred embodiment of the present invention has a configuration extending along a first axis A1, a second axis A2 and a third axis A3, wherein the first axis A1, the second axis A2 and the third axis A3 are orthogonal to each other. The ventilating apparatus 3 mainly comprises a main body 21, a tail pipe 22 and an outer pipe 34. The main body 21 has a head end 212 and a tail end 213 disposed along the second axis A2, two sidewalls 214 disposed along the third axis A3, and a first aperture 215 passing through the main body along the first axis A1 near the head end 212. The first aperture 215 is configured to allow a capillary (not shown) which is supplied therein with a metal wire to pass therethrough so that when contacting a discharging device (not shown), the metal wire is heated and melted to be sintered and form a FAB. In addition, the tail pipe 22 of the ventilating apparatus 3 is connected to the tail end 213 of the main body and has a second aperture 221 passing therethrough along the second axis A2. The second aperture 221 is connected to the first air orifice 216. In the present embodiment, the outer pipe 34 have features and effects substantially equal to those of the outer pipe 34 of the second preferred embodiment, and will not be repeatedly described herein. In the present embodiment, the outer pipe 34 further comprising an air inlet 346, wherein the air inlet 346 is connected to the bypassing channels 113511 of the outer pipe 34, the air inlet 346 have features and effects substantially equal to those of the air inlet 346 of the second preferred embodiment, and will not be repeatedly described herein.

The present invention has been described with reference to preferred embodiments thereof and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A ventilating apparatus having a configuration extending along a first axis, a second axis and a third axis, wherein the first axis, the second axis and the third axis are orthogonal to each other, the ventilating apparatus comprising:
a main body having a head end and a tail end disposed along the second axis, two sidewalls disposed along the third axis, and a first aperture passing therethrough along the first axis near the head end of the main body, wherein the main body further has a first air orifice and bypassing air orifices, the first air orifice being configured along the second axis and passing from the tail end of the main body to the first aperture, and the bypassing air orifices connecting the first air orifice and the first aperture, and the bypassing air orifices includes a pair of second air orifices, a pair of third air orifices and a pair of fourth air orifices, each said second air orifices having two ends closed, each said third air orifices and fourth air orifices having an end near the corresponding sidewall of the main body closed, each said third air orifices connecting the second air orifices and the first air orifices, and each said fourth air orifices connecting the second air orifices and the first aperture; and
a tail pipe being connected to the tail end of the main body and having a second aperture passing therethrough along the second axis, wherein the second aperture is connected to the first air orifice.

2. The ventilating apparatus of claim 1, wherein the second air orifices are along the second axis.

3. The ventilating apparatus of claim 1, while the third air orifices are along the third axis.

4. The ventilating apparatus of claim 1, wherein the fourth air orifices are along the third axis.

5. The ventilating apparatus of claim 1, wherein the first aperture in configured between the second air orifices.

6. The ventilating apparatus of claim 1, wherein the head end of the main body further comprises a pair of depressed shoulder portions corresponding to the second air orifices, respectively.

7. The ventilating apparatus of claim 1, further comprising a plurality of sealing members, which are attached to the second air orifices near the head end of the main body.

8. The ventilating apparatus of claim 1, further comprising a plurality of sealing members, which are attached to the third air orifices near the sidewalls of the main body.

9. The ventilating apparatus of claim 1, further comprising a plurality of sealing members, which are attached to the fourth air orifices near the sidewalls of the main body.

10. The ventilating apparatus of claim 1, wherein each of the second air orifices has a diameter smaller than diameters of both of the first aperture and the first air orifice.

11. The ventilating apparatus of claim 1, wherein each of the third air orifices has a diameter smaller than diameters of both of the first aperture and the first air orifice.

12. The ventilating apparatus of claim 1, wherein each of the fourth air orifices has a diameter smaller than diameters of both of the first aperture and the first air orifice.

13. A ventilating apparatus having a configuration extending along a first axis, a second axis and a third axis, wherein the first axis, the second axis and the third axis are orthogonal to each other, the ventilating apparatus comprising:
a main body having a head end and a tail end disposed along the second axis, two sidewalls disposed along the third axis, and a first aperture passing therethrough along the first axis near the head end of the main body, wherein the main body further has a first air orifice and bypassing air orifices, the first air orifice being configured along the second axis and passing from the tail end of the main body to the first aperture, and the bypassing air orifices connecting the first air orifice and the first aperture;
a tail pipe being connected to the tail end of the main body and having a second aperture passing therethrough along the second axis, wherein the second aperture is connected to the first air orifice; and
an outer pipe having a bottom segment and two side segments connected to two ends of the bottom segment so as to be formed as a U-shaped pipe that allows the main body to be fittingly received in an area defined by the U-shaped pipe with the head end of the main body adjacent to the bottom segment, the outer pipe further comprising bypassing channels and a plurality of air vents, the bypassing channels being configured inside the bottom segment and the side segments, and the air vents connecting the bypassing channels to an exterior of the outer pipe.

14. The ventilating apparatus of claim 13, wherein the bypassing channels further includes a fifth air orifice and a pair of sixth air orifices, the fifth air orifice being configured at the bottom segment along the third axis with two ends thereof closed, each said sixth air orifice being configured at a respective said side segment along the second axis, and each said sixth air orifice being connected to the fifth air orifice.

15. The ventilating apparatus of claim 13, further comprising an air inlet, wherein the air inlet is connected to the bypassing channels of the outer pipe.

16. A ventilating apparatus having a configuration extending along a first axis, a second axis and a third axis, wherein the first axis, the second axis and the third axis are orthogonal to each other, the ventilating apparatus comprising:
a main body having a head end and a tail end disposed along the second axis, two sidewalls disposed along the third axis, a first aperture passing therethrough along the first axis near the head end of the main body, and a first air orifice extending along the second axis, wherein the first air orifice passes through from the tail end of the main body to the first aperture;
a tail pipe being connected to the tail end of the main body and having a second aperture passing therethrough along the second axis, wherein the second aperture is connected to the first air orifice; and
an outer pipe having a bottom segment and two side segments connected to two ends of the bottom segment so as to be formed as a U-shaped pipe that allows the main body to be fittingly received in an area defined by the U-shaped pipe with the head end of the main body adjacent to the bottom segment, the outer pipe further comprising bypassing channels and a plurality of air vents, the bypassing channels being configured inside the bottom segment and the side segments, and the air vents connecting the bypassing channels to an exterior of the outer pipe.

17. The ventilating apparatus of claim 16, wherein the bypassing channels further includes a fifth air orifice and a pair of sixth air orifices, the fifth air orifice being configured at the bottom segment along the third axis with two ends thereof closed, each said sixth air orifice being configured at a respective said side segment along the second axis, and each said sixth air orifice being connected to the fifth air orifice.

18. The ventilating apparatus of claim 16, further comprising an air inlet, wherein the air inlet is connected to the bypassing channels of the outer pipe.

* * * * *